Figure 1:
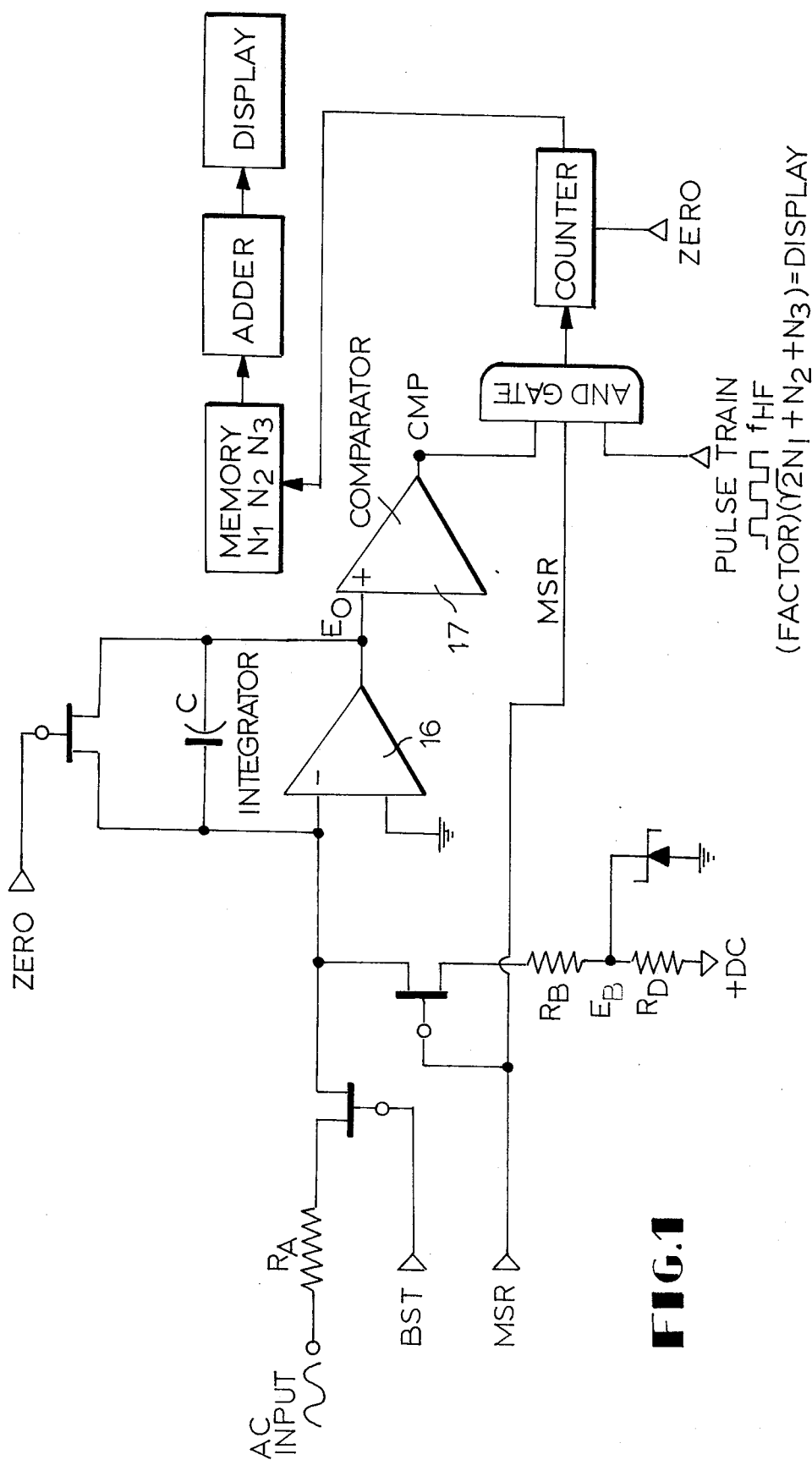

United States Patent [19]

Hall

[11] 4,181,949

[45] Jan. 1, 1980

[54] METHOD OF AND APPARATUS FOR PHASE-SENSITIVE DETECTION

[75] Inventor: Henry P. Hall, Concord, Mass.

[73] Assignee: GenRad, Inc., Concord, Mass.

[21] Appl. No.: 889,654

[22] Filed: Mar. 24, 1978

[51] Int. Cl.² .......................................... H03K 13/17
[52] U.S. Cl. .................................. 364/487; 324/119; 340/347 NT
[58] Field of Search .............................. 364/482, 487; 340/347 AD, 347 NT; 324/119, 128

[56] References Cited

U.S. PATENT DOCUMENTS

| | | | |
|---|---|---|---|
| 3,445,763 | 5/1969 | Harris, Jr. | 364/482 |
| 3,875,503 | 4/1975 | Hayashi | 340/347 NT |
| 3,876,933 | 4/1975 | Herrington | 340/347 NT |
| 3,879,724 | 4/1975 | McDonald | 340/347 NT |
| 4,081,800 | 3/1978 | Amemiya et al. | 340/347 NT |

OTHER PUBLICATIONS

Watson, J. P., "A Low Cost Precision A/D System"; *Electronics Industry*; Dec. 1976; pp. 21-25; vol. 2, No. 11.

*Primary Examiner*—Errol A. Krass
*Attorney, Agent, or Firm*—Rines and Rines, Shapiro and Shapiro

[57] ABSTRACT

This disclosure is concerned with novel approximations to sine-wave sampling by successive measurements and digital conversion in phase-sensitive detection circuits, simplifying switching requirements and providing harmonic immunity.

11 Claims, 11 Drawing Figures

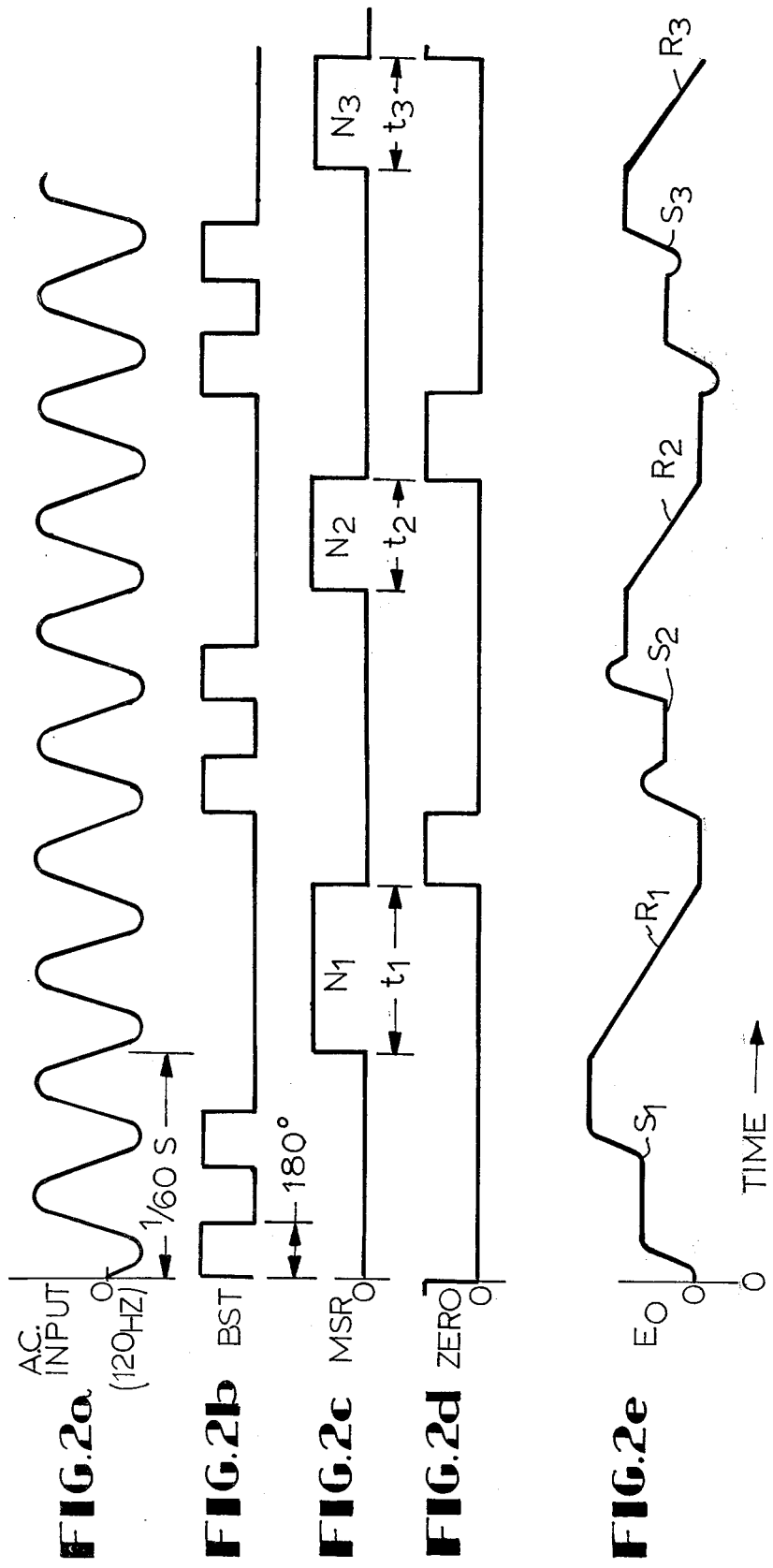

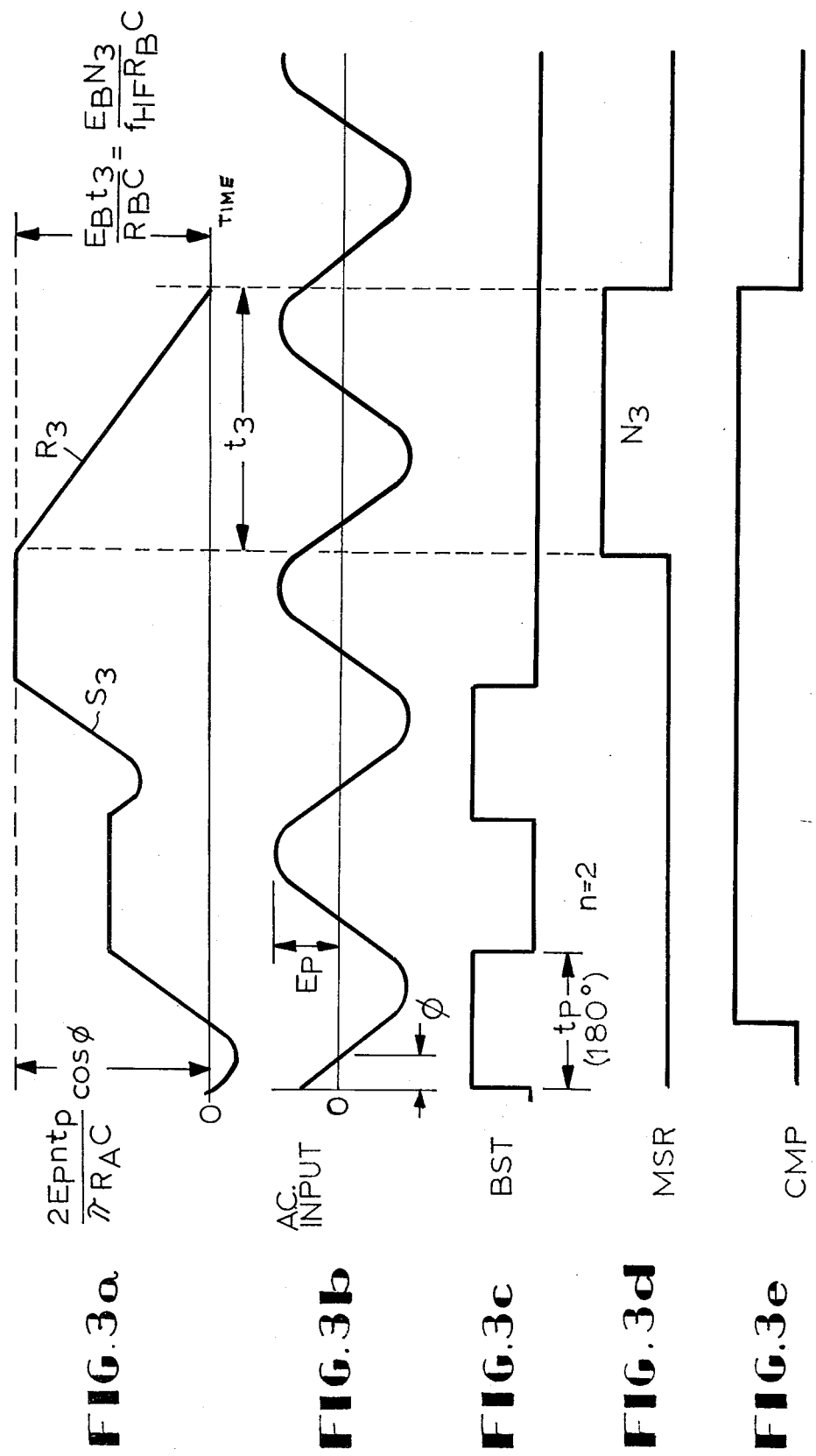

METHOD OF AND APPARATUS FOR PHASE-SENSITIVE DETECTION

BACKGROUND OF THE INVENTION

The present invention relates to phase-sensitive detection apparatus and methods, being more particularly concerned with sampling-type detectors.

Prior sampling-type, phase-sensitive detectors can be considered as multipliers, providing a dc output corresponding to that obtainable from the product of the sampling signal and the signal to be detected. The frequency response of such detectors is the Fourier transform of the sampling signal. An impulse sample gives an infinite bandwidth because an impulse contains all frequencies. A pulse sample duration T gives a frequency response in the form sin x/x (where $x = \pi f/f_o$ and $f_o = 1/2T$), the same form as the Fourier transform of such a pulse, which is insensitive to even harmonics ($f-2f_o$, $4f_o$, etc.), and attenuates the odd harmonics at, for example, a 20 db/decade rate. A sine-wave sample, however, would give the best response, being immune to all harmonics; but it would require a multiplier circuit which, for some applications, is beyond the state of the present art in terms of required accuracy. Its complexity would also be undesirable.

Approximations to sine-wave sampling have accordingly been proposed, in order to make a phase-sensitive detector immune to 3rd, 5th and higher harmonics. One such is described, for example, in U.S. Pat. No. 3,517,298, and in an article by Peter Richman and Norman Walker entitled "A New Fast Coupling RMS-to-DC Conversion" appearing in the IEEE Transactions on Instrumentation and Measurement, Vol. 1M-20, No. 4, November, 1971, pp. 313-319.

In accordance with the present invention, however, in summary, the necessity for multiple switches, with their attendant complexity, is obviated through the concept of making three (or more) successive, half-wave measurements (180° long) and adding their results in a microprocessor with appropriate weighting factors. Instead of taking the analog sum of three pulses 180 degrees in length and 45° apart, this method uses three separate pulses (or sets of pulses) 180° in length which occur separately, one at a time, but whose starting points in time (or phase), relative to a continuous test signal, change by 45° increments; that is, they might have starting points with respect to a fixed point in time of 0°, 405° (or 360°+45°), and 810° (or 720°+90°). The digital results of measurements using such samples are added digitally. Thus, this principle of using successive pulses enables the obtaining of the same results as would be obtained by adding pulses that overlap in time and, through employing successive half-wave measurements, synthesize an equivalent of, or approximation to, a sine-wave sampling waveform.

While of more general utility, as well, this technique, when applied to systems such as impedance bridges employing microprocessors in directly calculating impedance values from measurements, has the particular further advantage of improving the D-accuracy when slow measurement rates are used. Such bridges are described, for example, in my article entitled "Analog Tests: the microprocessor scores", appearing in the IEEE Spectrum, April, 1977, pp. 36-40; in an article entitled "MPU-Based, Easy-to-Use, Lower Cost RLC Component Test System," Evaluation Engineering, November/December, 1976, p. 22; and in my copending U.S. patent application, Ser. No. 719,810, filed Sept. 2, 1976.

An object of the present invention, accordingly, is to provide a new and improved method of and apparatus for sampling type phase-sensitive detection embodying approximations to sine-wave sampling and obviating prior disadvantages, including those above-described.

A further object is to provide such a novel phase-sensitive detection technique and apparatus particularly adapted for impedance bridges employing microprocessors for calculating impedance values from measurements effected in the circuits.

Other and further objects will be explained hereinafter and are more particularly delineated in the appended claims.

In summary, from one of its broad aspects, the invention embraces a method of phase-sensitive detection of an input AC signal, that comprises, generating an approximate sine-wave sampling waveform by successively integrating the input signal over each of at least three measurement time intervals each of 180° duration and successively 45° phase-displaced; converting each of the three resulting measurements after it is made to a digital number; and adding the numbers with appropriate weighting to obtain a measurement of the fundamental component of voltage of the input signal with immunity to at least 3rd and 5th harmonics. Preferred details are hereinafter set forth.

The invention will now be described with reference to the accompanying drawings, FIG. 1 of which is a circuit diagram of a preferred embodiment of the invention employing the method thereof;

FIGS. 2a through e are waveforms explanatory of the voltages at different positions of the circuit of FIG. 1; and FIGS. 3a through e are expanded waveforms of a part of the sampling intervals shown in FIGS. 2a through e.

While the method of dual-slope phase-sensitive detection, with successive measurement sine-wave sampling approximation herein disclosed is more broadly applicable, it will be described for illustrative purposes in connection with a preferred application to impedance or similar measurement instruments embodying calculator apparatus, such as a microprocessor, for the purpose of calculating impedance or other values from a series of measurements obtained in the instrument as described, for example, in my said copending application, Ser. No. 719,810, and in my previously mentioned articles.

Referring to FIG. 1, the invention has been illustrated as embodying a dual-slope phase-sensitive detector the amplifier 16 of which is shown shunted by an integrating or averaging capacitor C which, in turn, is schematically illustrated as shunted by a zeroing FET switch, labelled "zero".

The input AC signal is applied through the input resistor $R_A$ and a further FET or similar switch BST (meaning a pulse burst control) to one input terminal (—) of the amplifier 16. The other input of the amplifier 16 is shown grounded. A DC reference voltage $E_B$ is obtained across a zener-diode-shunted resistor $R_D$ and is applied through a reference resistor $R_B$, under the control of a further FET or similar switching device MSR, to the (−) input terminal of the amplifier 16 receiving the AC input signal. The symbol MSR represents that this FET controls the measuring intervals that are to convert the analog signals into digital signals, corresponding to successive measurements to be effected in the system. The digital conversion is effected by having the MSR signal also applied to a gate, labelled "AND GATE", into which consistent high-frequency pulse train signals $f_{HF}$ are applied.

This gate receiving the MSR and $f_{HF}$ pulses (such as 25 MHz), is closed by the output $E_o$ of the amplifier 16 as applied through a comparator 17 that determines whether the output is above or below ground. When the gate is closed, the measurement period is terminated and this stops the count in the COUNTER. After each measurement period, the resulting count is, therefore, stored in a memory, so labelled, which may be part of a microprocessor, for example, with successive stored counts $N_1$, $N_2$, $N_3$, etc., corresponding to successive measurements, thereafter appropriately added and displayed as indicated. As hereinafter explained, the display referred to is the display of but one component of phase of the input voltage as thus far illustrated.

In an actual application for impedance measurement, for example, several components (at least 2 phase components) would be required to obtain a calculated complex impedance. While only one such voltage measurement is shown in FIG. 1, this is for illustration, and it is deemed sufficient to explain the principles of the invention in the most simple form. Further information on the additional measurements is contained in my said articles and copending application, and is not essential to the novel features of thie present invention.

Referring to FIG. 2, waveforms explanatory of the operation of the system of FIG. 1 are presented. FIG. 2a represents the AC input signal; FIG. 2b, the burst pulses (BST), shown as in pairs in this example; FIG. 2c, the measurement gating pulses (MSR), which determine the measurement intervals $t_1$, $t_2$ and $t_3$ or counts $N_1$, $N_2$, $N_3$, etc.; FIG. 2d, the zeroing pulses to clear the integrator capacitor C; and FIG. 2e, representing the dual-slope output voltage $E_o$ from the amplifier 16.

As shown in this example, two bursts of BST pulses (FIG. 2b), each of substantially 180° phase and corresponding to the fundamentals of the AC input signal of FIG. 2a, are shown occuring during the first and second positive half cycles of the input signal. It is, of course, to be understood that any other starting phase could be used. The second set of burst pulses BST is similarly 180° in duration and is shown occuring in FIG. 2b commencing with a point 45° delayed in phase from that of the first pair of burst pulses; and the third set of burst pulses is shown advanced another 45° with respect to the first group of burst pulses.

In FIG. 2c, the measurement periods are illustrated by the counts $N_1$, $N_2$, and $N_3$, corresponding to the counter accumulations during the reverse-slope periods $R_1$, $R_2$, and $R_3$ in the output waveform $E_o$ of FIG. 2e. The leading edge slopes $S_1$, $S_2$, and $S_3$ of FIG. 2e represent the analog resultant voltages from the effective sampling of the AC input signal of FIG. 2a by the sets, or groups, of burst pulses BST, FIG. 2b.

Thus, when the first count N1 is fed from the counter to the memory, following the completion of the measurement interval N1 of FIG. 2c, it is stored, and the zero pulse of FIG. 2d is thereupon applied to the counter. This same zeroing serves also to terminate the reverse slopes $R_1$, $R_2$, and $R_3$.

By the three successive integrating measurement samples, each occuring over measurement time intervals of 180° and each successively 45° phase-displaced, the integrator measurements of the input signal have been converted into the respective digital numbers N1, N2, and N3. The numbers are added in the adder, and, with appropriate weighting factors, enable obtaining a measurement of the fundamental component of voltage—in this case of one phase of the input signal. Through the overall effective approximate sine-wave sampling effected by this procedure, the advantage is attained that the displayed or otherwise utilized measurement of such fundamental component of the voltage of the input signal will be immune at least to the third and fifth harmonics. The same process can be applied to eliminate other harmonics, as well, which would require more pulses at different relative phase angles.

This operation is thus distinguished from the step-waveform approximations to the sine-wave sampling of the prior art, such as the before-mentioned Richman technique. It does not employ the repetitive generation of step-sampling waveforms, as in the prior art multiplier switching systems, and it embodies conversions of the successive integrated signal measurements into the digital numbers following each measurement. Additionally, the present invention is particularly adapted for dual-slope phase-detection, and further utilizes a plurality of repetitive measurement intervals in successive groups, with the measurement periods of each successive group phase-displaced; in the example given, by 45° from the preceding group. As a result of these marked differences, the number of required circuit components, particularly signal switches, is significantly reduced; and the digital conversion is made in essentially one operation.

Turning, now, to a more detailed description of the above-described measurements, reference may be made to FIG. 3, wherein FIG. 3a illustrates a typical output voltage $E_o$ similar to the third measurement of FIG. 2e; FIG. 3b, the AC input signal; FIG. 3c, the corresponding BST waveforms; FIG. 3d, the MSR waveform; and FIG. 3e, the CMP or comparator output.

The going-positive of the burst signals BST, FIG. 3c, causes the BST-FET (FIG. 1) to open, starting current flow through the resistor input $R_A$ which is accumulated in integrator capacitor C, and changing the output voltage $E_o$ to a negative input signal, thereby causing the integrator output to go positive, as shown. Though the signal, FIG. 3b, is delayed from the burst and starts as an initial negative output, the integrated total becomes positive. The second BST pulse doubles the output voltage $E_o$ as at $S_3$, FIG. 3a, to the total value of the voltage given by the formula to the right in FIG. 3a. The MSR signal is turned on, allowing the DC current to flow through $R_B$ and causing the output voltage to decrease linearly on the reverse slope $R_3$ until it has reached zero. Voltages of the operation are stopped, as before stated, by the output of the comparator 17. Since the voltage going up must equal that going down, time interval $t_3$, during which the counter accumulates count N3, FIG. 3d, is a measure of the AC in phase with the burst pulses. This time interval $t_3$ is converted into a digital number, using the gate and counter as previously described.

In connection with the application of the technique of the present invention to impedance measurements and the like, a system using elemental circuits of the type shown in FIG. 1 may be employed with four sets of measurements; specifically, two sets of measurements with one signal proportional to the voltage and another unknown and other sets of measurements with voltages corresponding to the current of the unknown. The two measurements of each of these signals give complements of voltage 90° apart from each other. From these four quantities, the complex value impedance of the unknown may be calculated if the phase of the current is known, as discussed in my said articles and copending application.

In such an application, the system of FIG. 1 has been applied for measurements with an AC input signal of 120 HZ using two pulses in each BST group. The total number of times for two complete cycles is equal to 1/60 of a second, thus making the measurement immune to pickup at the 60 Hz power line frequency. It was also applied for tests at 1020 Hz which used seventeen pulses in each pulse train (BST), so that, again, the total time was 1/60 second. If only one measurement is made, instead of three, for each of the 90° references required, the even harmonics are thus rejected completely, but the odd harmonics (third, fifth, etc.) will only decrease by a factor equal to their number; for example, the third harmonic has ⅓ the effect upon the fundamental with the three measurements as shown in FIG. 2. The third and fifth harmonics are subsequently totally rejected.

Appropriate weighting, as explained by Richman, supra, is required to get this rejection. In connection with the embodiments of the present invention, as explained in connection with FIGS. 1 and 2, this would be $\sqrt{2}$ N1+N2+N3, with the appropriate common proportional factor both ways.

As before stated, of course, the dual-slope phase detection technique of the invention is applicable in other types of systems, also, and further modifications will occur to those skilled in this art, all such being considered to fall within the spirit and scope of the invention as defined in the appended claims.

What is claimed is:

1. A method of phase-sensitive detection of an input AC signal, that comprises, generating an approximate sine-wave sampling waveform by successively integrating the input signal over each of at least three measurement time intervals each of 180° duration and successively 45° phase-displaced; converting each of the three resulting measurements after it is made to a digital number; and adding the numbers with appropriate weighting to obtain a measurement of the fundamental component of voltage of the input signal with insensitivity to at least 3rd and 5th harmonics of that voltage.

2. A method as claimed in claim 1 and in which said integrating is produced by dual-slope phase-detecting of the input signal, with the digital-converting step being effected by counting the time duration of the reverse slope of the dual slope in each of the successive measurement intervals.

3. A phase-sensitive dual-slope detector apparatus having, in combination, dual-slope detection means responsive to an input AC signal, means for providing in spaced successive time intervals groups of burst pulses and for applying the same to the detection means to effect forward-slope integration therein commencing with the start of each such time interval; means for providing impulses to be counted; means for initiating the commencement of the reverse slope operation of the dual slope detection means during each of the spaced successive time intervals and for thereupon counting said impulses for the duration of such reverse slope to digitize an analog voltage measurement of the input AC signal, in order to provide a plurality of digitized quantities representing measurements of the input AC signal during the reverse slope of each of the spaced successive time intervals; means for storing the digitized quantities; and means for adding the digitized quantities.

4. Apparatus as claimed in claim 3 and in which the burst pulse providing means provides 180° measurement time intervals successively phase-displaced by 45°.

5. Apparatus as claimed in claim 4 and in which the burst pulse providing means provides at least three repetitive measurement time intervals and the storing means stores the counts $N_1$, $N_2$ and $N_3$ corresponding to the intervals, respectively, in order to enable the said adding means to add the counts.

6. Apparatus as claimed in claim 5 and in which the three digitized quantities $N_1$, $N_2$ and $N_3$ are weighted to obtain from the said adding means a measurement of the fundamental component of voltage of the input signal with insensitivity to at least 3rd and 5th harmonics of that voltage.

7. Apparatus as claimed in claim 6 and in which said weighting is $\sqrt{2}$ $N_1+N_2+N_3$.

8. Apparatus as claimed in claim 6 and in which said dual-slope phase detection means comprises amplifier means having integration circuit means connected between its input and output, with the input connected to receive the AC input signal, and the output connected through comparator means with gate means in turn controlled to pass counting pulses to counter means to count the duration of said reverse slope and thereby digitize the analog voltage represented by that duration.

9. A phase-sensitive detector apparatus for an input AC signal having, in combination, means for approximately sine-wave sampling the said signal comprising means for successively averaging the input signal over each of at least three measurement time intervals each of 180° duration and successively 45° phase-displaced; means for converting each of the three resulting measurements after it is made to a digital number; and means for adding the numbers with appropriate weighting to obtain a measurement of the input signal with insensitivity to at least 3rd and 5th harmonics of that signal.

10. A phase-sensitive detector apparatus as claimed in claim 9 and in which the said averaging means comprises integrating means of dual-slope phase-detector means, and said converting means comprises means for counting the time duration of the reverse slope of the dual slope in each of the successive measurement intervals.

11. A phase-sensitive detector apparatus as claimed in claim 9 and in which the input AC signal is derived in impedance bridge means and the apparatus provides digital quantities corresponding to analog voltage measurements obtained in the bridge means.

* * * * *